(12) United States Patent
Arigliano

(10) Patent No.: US 6,967,488 B1
(45) Date of Patent: Nov. 22, 2005

(54) DOUBLE-MIRROR SHORT-CIRCUIT DETECTION

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/877,595

(22) Filed: Jun. 25, 2004

(30) Foreign Application Priority Data

Jun. 14, 2004 (EP) .................................. 04392030

(51) Int. Cl.⁷ .......................................... G01R 27/28
(52) U.S. Cl. ...................... 324/656; 324/523; 324/765; 361/18; 361/79
(58) Field of Search ................................ 324/656, 523, 324/522, 537, 765, 769; 361/18, 79, 78, 127

(56) References Cited

U.S. PATENT DOCUMENTS

| | | | |
|---|---|---|---|
| 5,973,569 A | 10/1999 | Nguyen | 330/298 |
| 6,008,972 A | 12/1999 | Pietrobon | 361/93.1 |
| 6,657,877 B2 | 12/2003 | Kashima et al. | 363/127 |
| 6,680,835 B2 | 1/2004 | Tabata | 361/79 |
| 6,683,765 B2 | 1/2004 | Kanamori | 361/18 |

FOREIGN PATENT DOCUMENTS

| | | | |
|---|---|---|---|
| EP | 0061730 A2 | 10/1982 | H02M 7/537 |
| JP | 2003283314 | 10/2003 | H03K 17/08 |

OTHER PUBLICATIONS

Co-pending U.S. Patent App. DS-04-015, "Self-Mirroring Current Mirror," Serial #10/874,473, filed Jun. 22, 2004, assigned to the same assignee.

*Primary Examiner*—Vincent Q. Nguyen
(74) *Attorney, Agent, or Firm*—George O. Saile; Stephen B. Ackerman

(57) ABSTRACT

The current mirror configuration includes four branches, a biasing branch, a first comparator branch, a second comparator branch and a measurement branch. The measurement branch is connected to a pad of the IC device and a measurement current is charged on to the pad. The measurement current is mirrored from the current of the biasing branch and the measurement current is mirrored to the second comparator branch. The biasing branch is mirrored to the first comparator branch using a scale that the current of the first comparator branch is smaller than the current of the biasing branch. In case of a short-circuit, the current of the measurement branch is larger than the current of the first comparator branch.

17 Claims, 1 Drawing Sheet

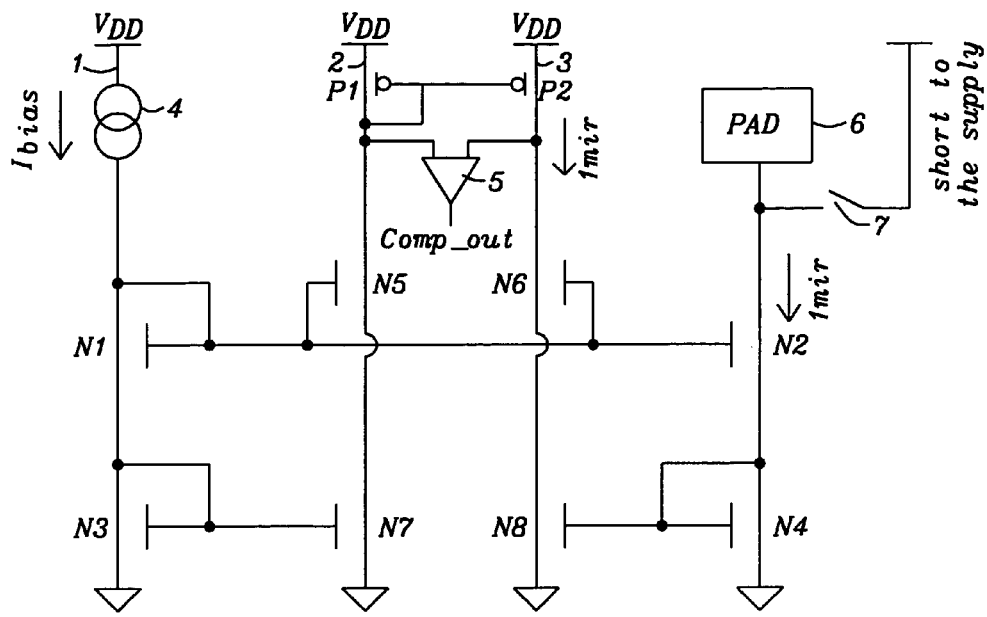

FIG. 1

Start

| Provide a comparator and a current mirror configuration having four branches, wherein a biasing branch is providing a bias current, a first comparator branch is providing a reference current, a second comparator branch is providing a mirrored measurement current, and a measurement branch is providing a test current | —20 |

↓

| Apply a test current to a pad of a floating IC device | —21 |

↓

| Mirror said test current | —22 |

↓

| Compare said mirrored test current with said reference current | —23 |

↓

| Use result of comparison of previous step to decide if there is a short-circuit condition of the IC pad tested | —24 |

FIG. 2

DOUBLE-MIRROR SHORT-CIRCUIT DETECTION

RELATED PATENT APPLICATION

This application is related to U.S. patent application Ser. No. 10/874,473 filed Jun. 22, 2004 and assigned to the same assignee as the present invention.

BACKGROUND OF THE INVENTION (1) Field of the Invention

This invention relates generally to current mirrors and relates more particularly to a short-circuit detection using a current mirror configuration.

(2) Description of the Prior Art

Current mirrors are the most widely use analog circuit. Most of the transistors in an analog integrated circuit are parts of current mirrors. A current mirror may be thought of as an adjustable current regulator, the current limit being easily set by a single resistance.

Current mirrors are used as current sources. An ideal current source has infinite output impedance. That is, the output current does not change, even for large swings in output voltage. This means that current mirrors have very high impedance.

A challenge to the designers of electronic circuits is to find a low-cost solution to detect short-circuits of IC devices. This is especially important for diagnostic and safety circuits. There are various patents in regard of this area.

(U.S. Pat. No. 6,683,765 to Kanamori) describes a switching power unit performing an over-current protecting operation by shortening a switching pulse, wherein an oscillation frequency changing circuit drops an oscillation frequency of an oscillator when an over-current is detected by an over-current detection circuit, and an RS flip-flop circuit performs the over-current protecting operation. When an output voltage is dropped due to a short circuit etc., the oscillation frequency changing circuit further drops the oscillation frequency of the oscillator. In an arrangement in which a frequency under a normal loading condition is made higher by considering the response delay in the over-current protecting operation in this manner, an over-current detection output is given to the oscillation frequency dropping circuit via the RS flip-flop circuit, so that it is necessary to provide a time constant circuit which prevents hunting and it is possible to miniaturize chip size of an integrated circuit itself. As a result, in the switching power unit for performing the over-current protecting operation, it is possible to miniaturize externally provided parts by making a switching frequency higher and to miniaturize the integrated circuit itself.

(U.S. Pat. No. 6,657,877 to Kashima et al.) discloses a power supply circuit improving the power factor when the load is light, and incorporates a starting circuit for reacting quickly to the changes in the output from the power supply circuit and a short-circuit detecting means for detecting the short-circuit of the feedback signal. The apparatus includes: an error amplifier; a comparator that monitors the output from the error amplifier and generates an offset regulating current I.sub.SO; a multiplier; a sensing current comparator that compares the output signal from the multiplier and the AC line current and generates a reset signal; a timer that directly monitors the inputted zero-cross signal; and a comparator for short-circuit detection, that facilitates reducing the exterior parts and components.

(U.S. Pat. No. 6,680,835 to Tabata) describes a semiconductor device comprising a short circuit protecting system capable of enhancing the detection precision of a collector current, thereby carrying out a reliable short circuit protection. An IGBT (1) having a collector (C) connected to a terminal (T1) and an emitter (E) connected to a terminal (T2) is provided, and has a sense emitter (SE) connected to a terminal (T2) through a variable resistor (VR1) to be a current and voltage converting section. A sense potential is output from an end on the sense emitter (SE) side of the variable resistor (VR1) and is given to a terminal (T11) of a current ratio detecting section (15). A gate of the IGBT (1) is connected to a terminal (T3) and an output of the current ratio detecting section (15) is connected to a terminal (T4).

SUMMARY OF THE INVENTION

A principal objective of the present invention is to achieve a circuit and a method to detect efficiently short-circuits of an IC device.

In accordance with the objects of this invention a circuit to detect efficiently short-circuits of an IC device has been achieved. The circuit, based on a current mirror configuration having four branches, is comprising, firstly, a biasing branch comprising a current source and two NMOS transistors, wherein the current source is connected between VDD voltage and the drain of a first NMOS transistor, said drain is connected to the gate of the first NMOS transistor, the source of the first NMOS transistor is connected to the gate and to the drain of a second NMOS transistor, and the source of the second NMOS transistor is connected to ground. The next branch is a first comparator branch comprising two NMOS transistors and one PMOS transistor, wherein the source of the PMOS transistor is connected to VDD voltage and the gate and the drain of said PMOS transistor are connected to a first input of a comparator and to the drain of a first NMOS transistor, wherein the gate of this first NMOS transistor is connected to the gate of the first NMOS transistor of said biasing branch and the source of the first NMOS transistor is connected to the drain of a second NMOS transistor, the source of the second NMOS transistor is connected to ground and the gate of the second NMOS transistor is connected to the gate of the second NMOS transistor of the biasing branch. Furthermore a second comparator branch is comprising two NMOS transistors and one PMOS transistor, wherein the source of the PMOS transistor is connected to VDD voltage, its gate is connected to the gate of the first PMOS transistor of the first comparator branch, and the drain of said PMOS transistor of the second comparator branch is connected to a second input of a comparator and to the drain of a first NMOS transistor, wherein the gate of this first NMOS transistor is connected to the gate of the first NMOS transistor of said first comparator branch and the source of the first NMOS transistor is connected to the drain of a second NMOS transistor, the source of the second NMOS transistor is connected to ground and the gate of the second NMOS transistor is connected to the gate and the drain of a second NMOS transistor of the measurement branch. The last branch is a measurement branch, comprising a contact point to a pad of an IC device and two NMOS transistors, wherein said contact point is connected to the drain of the first NMOS transistor of the measurement branch, the gate of this first transistor is connected to the gate of the first transistor of the second comparator branch, the source of this first transistor is connected to the drain and to the gate of the second NMOS transistor, the gate of the second NMOS transistor is connected to the gate of the second transistor of the second comparator branch and the source of the second transistor is connected to ground. The circuit invented comprises also a comparator having two input and one output, wherein a first input is connected to the drain of the first NMOS transistor of the first comparator branch and the second input is connected to the drain of the first NMOS transistor of the second comparator branch and the output is providing a signal indicating if there is a short-circuit condition on the IC pad to be tested.

In accordance with the objects of this invention a method to detect short-circuits of a pad of an IC device has been achieved. Said method comprises, firstly, providing a comparator and a current mirror configuration having four branches, wherein a biasing branch is providing a bias current, a first comparator branch is providing a reference current, a second comparator branch is providing a mirrored measurement current, and a measurement branch is providing a test current. The next steps of the method invented are to apply a test current to a pad of a floating IC, to mirror said test current, to compare said mirrored test current with said reference current, and to use the result of comparison of previous step to decide if there is a short-circuit condition of the IC pad tested.

BRIEF DESCRIPTION OF THE DRAWINGS

In the accompanying drawings forming a material part of this description, there is shown:

FIG. 1 shows a schematic of the circuit of the present invention.

FIG. 2 illustrates a flowchart of a method to detect short-circuits on a pad of an IC device.

DESCRIPTION OF THE PREFERRED EMBODIMENTS

The preferred embodiments disclose a novel circuit and a related method to detect efficiently an event of short-circuits on IC device pads.

In many applications, especially in the automotive industry, short-circuit detection on IC device pads is required for safety reason. One example is the detection of short-circuits on IC devices controlling air bags or brake systems.

FIG. 1 shows a principal schematic of a preferred embodiment of the present invention. It shows a current mirror configuration having four branches, a biasing branch 1, a first comparator branch 2, a second comparator branch 3, and a measurement branch 4.

The biasing branch 1 is comprising a current source 4 and two NMOS transistors N1 and N3, wherein the source of N1 is connected to the drain of N3, the drain of N1 is connected to a first terminal of a current source 4, and the source of N3 is connected to ground. The gate of N3 is connected to the drain of N3. The second terminal of the current source 4 is connected to VDD voltage. The current IBIAS is flowing through branch 1.

The first comparator branch 2 is comprising one PMOS transistor P1, two NMOS transistors N5 and N7, wherein the source of N5 is connected to the drain of N7, the drain of N5 is connected to the drain and gate of P1 and to a first input of a comparator 5, the source of N7 is connected to ground, and the source of P1 is connected to VDD voltage. The gate of N5 is connected to the gate and to the drain of N1. The gate of N7 is connected to the gate and drain of N3.

In a preferred embodiment the channel width of N5 is half the channel width of N1 wherein both transistors N1 and N5 have the same channel length and the channel width of N7 is half the channel width of N3 wherein both transistors N7 and N3 have the same channel length. The size of N5 is therewith half the size of N1 and the size of N7 is half the size of N3 thus the current flowing through the first comparator branch 2 is half of the current IBIAS flowing through the biasing branch 1.

The measurement branch 4 comprises a pad 6 of an IC device and two NMOS transistors N2 and N4, wherein the source of N2 is connected to the drain of N4, the drain of N2 is connected to the pad 6 of an IC device and the source of N4 is connected to ground, The gate of N4 is connected to the drain of N4. The gate of N2 is connected to the gates of N1, N5, and N6 and to the drain of N1. The measurement branch 4 behaves as a current mirror of the biasing branch 1, similar to the current mirrors disclosed in U.S. patent application Ser. No. 10/874,473 filed Jun. 22, 2004, being attached to the measurement branch 4 in a cascode configuration.

In a preferred embodiment of the present invention transistor N2 has the same size as transistor N1 and furthermore transistor N4 has the same size as transistor N3. Therefore, in case there is a short-circuit from the PAD 6 to supply voltage, the same current is flowing through the measurement branch 4 and the biasing branch 1.

The second comparator branch 3 is comprising one PMOS transistor P2, two NMOS transistors N6 and N8, wherein the source of N6 is connected to the drain of N8, the drain of N6 is connected to the drain of P2 and to the second input of the comparator 5, the source of N8 is connected to ground, and the source of P2 is connected to VDD voltage. The gate of N8 is connected to the gate and to the drain of N4. The gate of N6 is connected to the gates of N2, N5 and N1.

The two PMOS transistors P1 and P2 have the same size. P1 and P2 create a current mirror from the first comparator branch 2 to the second comparator branch 3 with a gain factor of 1. This current mirror forces the second comparator branch 3 to the same current, IBIAS/2, of the first comparator branch 2. Furthermore the current flowing in the second comparator branch 3 is also forced by the transistors N6 and N8 to be equal to the current in the measurement branch 4.

The symbol of a switch 7 indicates a possible short circuit to supply voltage. As a key point of the present invention the current IMIR, flowing through the measurement branch 4, is forced into a pad 6 of an IC device while said PAD 6 is floating.

The actual short-circuit detection is performed by comparator 5. This comparator 5 compares the current through the first comparator branch 2 with the current through the second comparator branch 3. Due to the relationship of the size of transistors between N1 and N5 and correspondently between N3 and N7 only half of the current IBIAS flows through the first comparator branch 2. The current IMIR through the second comparator branch 3 can have two values. In case there is no short-circuit in the measurement branch 4, no current flows neither in the measurement branch 4 nor in the second comparator branch 3 and the comparator 5 detects that the current IBIAS/2 in the first comparator branch 2 is larger than the current IMIR of the second comparator branch 3:

$$\frac{I_{BIAS}}{2} > I_{MIR}.$$

The related output signal of comparator 5 indicates "no short-circuit situation".

In case there is a short-circuit situation of the PAD 6 a current IMIR is flowing through the measurement branch 4 and through the second comparator branch 3: IMIR=IBIAS.

In this situation transistors N1, N3, N4, and N8 have a current mirror operation with the same current IBIAS flowing through the bias branch 1, the second comparator branch 3 and the measurement branch 4.

This means the comparator 5 detects that the current in the second comparator branch 3 is larger than the current IBIAS/2 in the first comparator branch 2.

$$\frac{I_{BIAS}}{2} > I_{MIR}.$$

The related output signal of comparator 5 indicates "short-circuit situation".

In a preferred embodiment the NMOS transistors N1, N2, and N6 have the same size (identical channel length and channel width) and transistor N5 has half the size of N1, N2, and N6. The size of transistor N5 could be alternatively any other suitable fraction of the size of N1, N2, and N6. Transistors N3, N4 and N8 have amongst them also an identical size, while transistor N7 has half the size of N3, N4, and N8. The size of transistor N7 could be alternatively any other suitable fraction of the size of N3, N4, and N8.

Transistors P1 and P2 are two PMOS transistors having the same size.

The circuit shown in FIG. 1 could also be implemented by replacing all the NMOS transistors shown in FIG. 1 by PMOS transistors and replacing the pair of PMOS transistors by a pair of NMOS transistors. The correspondent PMOS transistors will have the same relations in size amongst them as the correspondent NMOS transistors shown in FIG. 1. Furthermore said pair of NMOS transistors, which has replaced said pair of PMOS transistors will have an identical size. Additionally the terminals for ground voltage and VDD voltage have to be replaced vice versa.

FIG. 2 shows a flowchart of the principal steps of a method to detect a short-circuit between a pad of a floating IC device to either ground or to a supply voltage. The first step 20 illustrates the provision of a comparator and of a current mirror configuration having four branches, wherein a biasing branch is providing a bias current, a first comparator branch is providing a reference current, a second comparator branch is providing a mirrored measurement current, and a measurement branch, is providing a test current.

In the following step 21 a test current is applied to a pad of a floating IC device and in the next step 22 said test current is mirrored to said second comparator branch of the current mirror configuration. In the following step 23 said mirrored test current is compared with said reference current, which is in the preferred embodiment a defined fraction of the current in the bias branch. In step 24 the result of the comparison of step 23 is used to decide if there is a short-circuit condition of the IC pad tested.

In case there is no short-circuit, no current is flowing in the measurement branch, consequently no current is flowing in the second comparator branch and the comparison between the current of the second comparator branch, which is a zero current, and the reference current shows that the reference current is larger than the zero current of the second comparator branch and this indicates a "no short-circuit" situation. In case of a short-circuit from the IC pad to the supply voltage a current which is equal to the bias current is flowing through the measurement branch 4 and is mirrored in a 1:1 relation to the second comparator branch 3. The comparison between the current of the second comparator branch 3 and the reference current which has the same size as the bias current, and the reference current, which has the size of a fraction of the bias current, shows that the reference current is smaller than the bias current of the second comparator branch 3 and this indicates a "short-circuit" situation.

It is obvious to those skilled in art that the scales used in mirroring can be flexible and there are a lot of different scales of mirroring possible. There only has to be a clear distinction possible between the size of the reference current and the size of the mirrored test current.

While the invention has been particularly shown and described with reference to the preferred embodiments thereof, it will be understood by those skilled in the art that various changes in form and details may be made without departing from the spirit and scope of the invention.

What is claimed is:

1. A method to detect short-circuits of a pad of an IC device is comprising:
   providing a comparator and a current mirror configuration having four branches, wherein a biasing branch is providing a bias current, a first comparator branch is providing a reference current, a second comparator branch is providing a mirrored measurement current, and a measurement branch is providing a test current;
   apply a test current to a pad of a floating IC;
   mirror said test current;
   compare said mirrored test current with said reference current; and
   use result of comparison of previous step to decide if there is a short-circuit condition of the IC pad tested.

2. The method of claim 1 wherein said test current is mirrored from the current in the biasing branch.

3. The method of claim 2 wherein said test current is mirrored from the current in the biasing branch using a scale of 1:1.

4. The method of claim 1 wherein said test current is mirrored to the current of said second comparator branch.

5. The method of claim 1 wherein said test current is mirrored to the current in the biasing branch using a scale of 1:1.

6. The method of claim 1 wherein the current of the biasing branch is mirrored to the current of the first comparator branch.

7. The method of claim 6 wherein said biasing current is mirrored to the current in the first comparator branch using a scale causing the current of the first comparator branch to be smaller than the current of the biasing branch.

8. The method of claim 7 wherein said scale is a half.

9. The method of claim 1 wherein said comparison is performed by said comparator comparing the current of the first comparator branch with the current of the second comparator branch.

10. The method of claim 9 wherein a "short-circuit" situation is indicated by the comparator if the current of the first comparator branch is smaller than the current of the second comparator branch.

11. The method of claim 9 wherein a "no short-circuit" situation is indicated by the comparator if the current of the first comparator branch is larger than the current of the second comparator branch.

12. A circuit of a current mirror configuration to detect short-circuits of a pad of an IC device having four branches is comprising:
- a biasing branch comprising a current source and two NMOS transistors, wherein the current source is connected between VDD voltage and the drain of a first NMOS transistor, said drain is connected to the gate of said first NMOS transistor, the source of said first NMOS transistor is connected to the gate and to the drain of a second NMOS transistor, and the source of said second NMOS transistor is connected to ground;
- a first comparator branch comprising two NMOS transistors and one PMOS transistor, wherein the source of said PMOS transistor is connected to VDD voltage and the gate and the drain of said PMOS transistor are connected to a first input of a comparator and to the drain of a first NMOS transistor, wherein the gate of said first NMOS transistor is connected to the gate of said first NMOS transistor of said biasing branch and the source of said first NMOS transistor is connected to the drain of a second NMOS transistor, the source of said second NMOS transistor is connected to ground and the gate of said second NMOS transistor is connected to the gate of said second NMOS transistor of the biasing branch;
- a second comparator branch comprising two NMOS transistors and one PMOS transistor, wherein the source of the PMOS transistor is connected to VDD voltage, its gate is connected to the gate of said first PMOS transistor of the first comparator branch, and the drain of said PMOS transistor is connected to a second input of said comparator and to the drain of a first NMOS transistor, wherein the gate of this first NMOS transistor is connected to the gate of said first NMOS transistor of said first comparator branch and the source of said first NMOS transistor is connected to the drain of a second NMOS transistor, the source of said second NMOS transistor is connected to ground and the gate of said second NMOS transistor is connected to the gate and the drain of a second NMOS transistor of the measurement branch;
- a measurement branch, comprising a contact point to a pad of an IC device and two NMOS transistors, wherein said contact point is connected to the drain of a first NMOS transistor of the measurement branch, the gate of this first transistor is connected to the gate of said first transistor of the second comparator branch, the source of said first transistor is connected to the drain and to the gate of the second NMOS transistor, the gate of said second NMOS transistor is connected to the gate of the second transistor of the second comparator branch and the source of the second transistor is connected to ground; and
- a comparator having two input and one output, wherein a first input is connected to the drain of said first NMOS transistor of the first comparator branch and the second input is connected to the drain of said first NMOS transistor of the second comparator branch and the output is providing a signal indicating if there is a short-circuit condition on the IC pad to be tested.

13. The circuit of claim 12 wherein all NMOS transistors are replaced by PMOS transistors and all PMOS transistors are replaced by NMOS transistors and VDD voltage is interchanged with ground voltage.

14. The circuit of claim 12 wherein the first transistor of the bias branch, the first transistor of the second comparator branch, and the first transistor of the measurement branch are having all a same size, wherein the first transistor of the first comparator branch has a size of a fraction smaller than the first transistor of the bias branch, and wherein the second transistor of the bias branch, the second transistor of the second comparator branch, and the second transistor of the measurement branch are having all a same size, and wherein the second transistor of the first comparator branch has a size of said fraction smaller than the second transistor of the bias branch.

15. The circuit of claim 14 wherein said fraction is a half.

16. The circuit of claim 12 wherein said comparator is providing a signal "short-circuit detection" if the current in the first comparator branch is smaller than the current in the second comparator branch and is providing a signal "no short-circuit detection" if the current in the first comparator branch is greater than the current in the second comparator branch.

17. The circuit system of claim 12 wherein said two PMOS transistors forming a current mirror between the first comparator branch and the second comparator branch have the same size.

* * * * *